(12) United States Patent
Valle

(10) Patent No.: US 10,710,341 B2
(45) Date of Patent: Jul. 14, 2020

(54) SHAPED COMPOSITE MATERIAL

(75) Inventor: Massimiliano Valle, Bergamo (IT)

(73) Assignee: Petroceramics S.p.A., Milan (IT)

( * ) Notice: Subject to any disclaimer, the term of this patent is extended or adjusted under 35 U.S.C. 154(b) by 476 days.

(21) Appl. No.: 14/401,243

(22) PCT Filed: May 16, 2012

(86) PCT No.: PCT/IT2012/000142
§ 371 (c)(1),
(2), (4) Date: Jan. 20, 2015

(87) PCT Pub. No.: WO2013/171770
PCT Pub. Date: Nov. 21, 2013

(65) Prior Publication Data
US 2015/0140256 A1 May 21, 2015

(51) Int. Cl.
*B32B 18/00* (2006.01)
*C04B 35/80* (2006.01)
(Continued)

(52) U.S. Cl.
CPC ............ *B32B 18/00* (2013.01); *C04B 35/565* (2013.01); *C04B 35/80* (2013.01); *C04B 35/806* (2013.01);
(Continued)

(58) Field of Classification Search
CPC ..... B32B 18/00; F16D 69/023; C23C 16/045; C04B 35/806; C04B 41/00; C04B 35/565; C04B 35/80; C04B 2237/584; C04B 2235/526; C04B 2235/5272; C04B 2235/5248; C04B 2237/38; C04B 2237/385; C04B 2235/5268;
(Continued)

(56) References Cited

U.S. PATENT DOCUMENTS 3,991,248 A * 11/1976 Bauer ................... C04B 35/806
427/249.2
5,662,192 A * 9/1997 Kingston ............... F16D 65/127
188/1.11 W
(Continued)

FOREIGN PATENT DOCUMENTS

EP 1 124 071 A1 8/2001
EP 2 058 545 A2 5/2009
(Continued)

*Primary Examiner* — Frank J Vineis
*Assistant Examiner* — Michael Zhang
(74) *Attorney, Agent, or Firm* — Blank Rome LLP

(57) ABSTRACT

The present invention concerns a shaped composite material and a method for producing it. More specifically, the invention concerns a disc for a disc brake made from ceramic composite materials, usually known as "CMC", i.e. "Carbon Material Ceramic" or "CCM", i.e. "Carbon Ceramic Material". These materials consist of carbon matrices containing carbon fibres usually infiltrated with silicon and a product of reaction between C and Si, silicon carbide (SiC).
More specifically, the invention concerns a shaped composite material comprising a inner layer (3; 103) of CCM C/SiC/Si material comprising disorderly short filaments consisting mainly of carbon and respective outer layers (2, 2'; 102, 102') of C/SiC/Si material and having an orderly fabric structure of mainly carbon fibres.

22 Claims, 1 Drawing Sheet

(51) Int. Cl.
 *C04B 35/565* (2006.01)
 *C04B 41/00* (2006.01)
 *C23C 16/04* (2006.01)
 *F16D 69/02* (2006.01)

(52) U.S. Cl.
 CPC ............ *C04B 41/00* (2013.01); *C23C 16/045* (2013.01); *F16D 69/023* (2013.01); *C04B 2235/526* (2013.01); *C04B 2235/5248* (2013.01); *C04B 2235/5268* (2013.01); *C04B 2235/5272* (2013.01); *C04B 2237/365* (2013.01); *C04B 2237/38* (2013.01); *C04B 2237/385* (2013.01); *C04B 2237/584* (2013.01); *Y10T 428/213* (2015.01); *Y10T 428/24967* (2015.01); *Y10T 428/249921* (2015.04); *Y10T 428/26* (2015.01)

(58) Field of Classification Search
 CPC ............. C04B 2237/365; C04B 35/573; Y10T 428/249921; Y10T 428/213; Y10T 428/24967; Y10T 428/26
 See application file for complete search history.

(56) References Cited

U.S. PATENT DOCUMENTS

| | | | | |
|---|---|---|---|---|
| 6,042,935 | A * | 3/2000 | Krenkel | C04B 35/573 156/329 |
| 6,077,607 | A * | 6/2000 | Zornik | C04B 41/009 188/218 XL |
| 6,221,475 | B1 * | 4/2001 | Domergue | C04B 35/806 428/292.1 |
| 6,514,592 | B1 * | 2/2003 | Hubbard | C04B 35/573 188/251 A |
| 6,802,403 | B2 * | 10/2004 | Goller | F16D 65/12 188/218 XL |
| 2003/0003286 | A1 * | 1/2003 | Gruber | C04B 35/573 428/293.4 |
| 2003/0146059 | A1 * | 8/2003 | Goller | F16D 65/12 188/218 XL |
| 2003/0180538 | A1 * | 9/2003 | Gray | C04B 35/524 428/408 |
| 2004/0127600 | A1 * | 7/2004 | Bauer | C04B 35/522 523/152 |
| 2007/0138677 | A1 * | 6/2007 | Goller | C04B 35/573 264/29.1 |
| 2007/0284772 | A1 | 12/2007 | Goller et al. | |
| 2008/0143005 | A1 | 6/2008 | Lim et al. | |
| 2009/0148699 | A1 * | 6/2009 | Fryska | C04B 35/6286 428/368 |

FOREIGN PATENT DOCUMENTS

| | | | | |
|---|---|---|---|---|
| EP | 2058545 | A2 * | 5/2009 | ........... C04B 35/565 |
| EP | 2 471 764 | A1 | 7/2012 | |
| JP | 10-507733 | | 7/1998 | |
| JP | 2007-535461 | | 12/2007 | |
| JP | 2008-526662 | A | 7/2008 | |
| JP | 2010-516617 | A | 5/2010 | |
| WO | WO 9853219 | A1 * | 11/1998 | ........... C04B 35/806 |
| WO | WO 2005/115945 | A1 | 12/2005 | |
| WO | WO 2006/070418 | A1 | 7/2006 | |
| WO | WO 2008/093078 | A1 | 8/2008 | |

* cited by examiner

SHAPED COMPOSITE MATERIAL

FIELD OF THE INVENTION

The present invention concerns a shaped composite material and a method for producing it. More specifically, the invention concerns a disc for a disc brake, preferably a ventilated disc, made from ceramic composite materials, usually called "CMC", i.e. "Carbon Material Ceramic" or "CCM", i.e. "Carbon Ceramic Material". These materials consist of carbon matrices containing carbon fibres usually infiltrated with silicon.

STATE OF THE ART

Ceramic composite materials (CCM) are generally used in many applications that require high resistance to compression and to the high temperatures generated by friction, which are characteristics that cannot be obtained with conventional ceramic materials that are characterised by high fragility. In particular, CCMs are widely used in the field of disc brakes.

For more extreme braking applications, like in the case of sports cars or even in other means of transport that travel at high speed, CCMs have been developed that combine various advantageous characteristics, such as high mechanical strength, high heat conductivity and excellent resistance to wear. Mechanical strength and high tenacity in particular can be highlighted in a limited formation of cracks in applications under stress. Heat conductivity, on the other hand, is important to quickly disperse the heat caused by the friction that develops on the disc of the brake during braking. Resistance to wear is another important parameter, since the friction generated during braking in the extreme situations described above could quickly consume the disc.

Other known discs are built with other carbon-based materials (known as Carbon Carbon, or "C/C"). These discs are obtained through a process that foresees the juxtaposition of layers of fabric, possibly the addition of resins and subsequent suitable heat treatments that lead to an increase in heat conductivity and carbon densifying processes, for example through CVD (Chemical Vapour Deposition), CVI (Chemical Vapour Infiltration) or LPI (Liquid Polymer Infiltration), which lead to an increase in density of from 4 to 6 times and give the material suitable mechanical properties. In some applications these materials can be used at this stage of development as materials consisting just of carbon. In order to work as friction material they need high temperatures of application that do not make them applicable for road applications, whether standard or top of the range.

Even the C/C preforms of these materials can, in a subsequent process stage, be infiltrated with silicon at high temperatures so that part of the carbon forms silicon carbide (SiC) by reaction with part of the infiltrated silicon (Si) and the material is fully densified, being characterised with residual porosity of less than 3%.

The materials described above, in the rest of the present description called CCM-R, are equipped with extremely high performance characteristics. Indeed, they have a flexural strength XY 45° comprised between 70 and 100 MPa, a flexural strength XY 90° comprised between 130 and 200 MPa and a heat conductivity on the plane XY comprised between 50 and 80 W/mK at 400° C. (40-60 W/mK at 400° C. on the axis Z). When compared with conventional CCM materials, which for example have a flexural strength comprised between 45 and 64 MPa and a heat conductivity comprised between 10 and 25 W/mK at 400° C., CCM-Rs are much more advantageous for extreme applications and for road applications.

However, CCM-Rs have the drawback of not being able to be moulded. In making ventilated discs this defect translates into the need to make the ventilation holes entirely by machining, with consequent high wastage of material and therefore very high costs, since CCM-R costs much more than conventional CCM.

The problem forming the basis of the present invention is therefore that of providing a shaped composite material, in particular a disc for a disc brake, which overcomes the drawbacks of the prior art and that therefore can maintain high performance characteristics even in extreme applications, but still allowing the production costs to be kept low, as well as a process for obtaining it that can be advantageously actuated in a conventional production plant.

SUMMARY OF THE INVENTION

The problem outlined above is solved by a shaped composite material and by a process for obtaining it as outlined in the attached claims, the definitions of which form an integral part of the present description.

An object of the invention is a shaped composite material comprising an inner layer of CCM material comprising short and disorderly filaments essentially consisting of carbon and respective outer layers of CCM-R material having an orderly, woven fabric structure, said shaped composite material having an average density comprised between 2.00 and 2.50 g/cmc.

Another object of the invention is a disc for a disc brake comprising an inner layer of CCM C/SiC/Si material comprising short and disorderly filaments of carbon and respective outer layers of CCM-R C/SiC/Si material having an orderly, woven fabric structure, said shaped composite material having an average density comprised between 2.00 and 2.50 g/cmc.

A further object of the invention is a process for obtaining the shaped composite material defined above that foresees:

a) the preparation of two preforms of CCM-R C/C material densified with carbon and having an orderly fabric structure, b) the arrangement in a mould of the two C/C preforms obtained according to step a) to constitute respective outer layers and of an intermediate layer of a precursor mixture of the CCM material essentially comprising carbon fibres and resin, c) the moulding and pyrolysis of the three-layer material obtained in step b), d) the infiltration with high-temperature silicon of the semi-worked product obtained in step c), e) the dry and/or wet finishing of the shaped composite material.

In step c) just the CCM material undergoes a reduction in volume whereas the two preforms of CCM-R do not modify their physical state.

Further characteristics and advantages of the invention will become clearer from the description of some example embodiments, made hereafter for indicating and not limiting purposes.

DETAILED DESCRIPTION OF THE INVENTION

Figure 1:
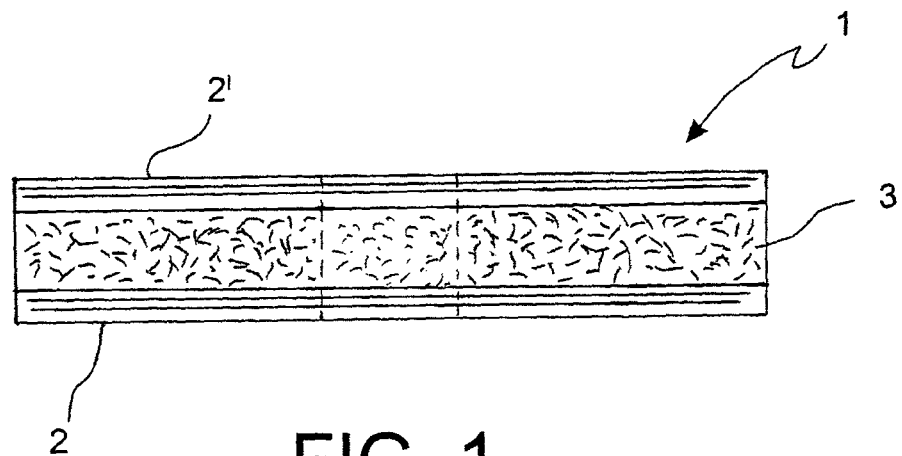
FIG. 1 represents a section view of a disc for a disc brake made with the shaped composite material according to a first embodiment.

An object of the invention is a shaped composite material comprising an inner layer of CCM material comprising short and disorderly filaments essentially consisting of carbon and respective outer layers of material having an orderly fabric structure (known as CCM-R in the present patent application).

In the rest of the present description the terms "CCM preform" and "CCM-R preform" will be used to indicate, respectively, the carbon preforms useful for making manufactured products, or parts of manufactured products, made from CCM or CCM-R material.

On the other hand, the terms "CCM" and "CCM-R" will be used to indicate, respectively, the manufactured products or parts of manufactured products made from CCM or CCM-R material.

By the term "filaments essentially consisting of carbon" we mean fibrous materials produced by pyrolysis of various products of synthetic origin, for example polyacrylonitrile (PAN) and polysilazane, or of natural origin, for example coal-tar pitches or vegetable fibres.

These filaments are normally made up of bands of fibres comprising from 3000 to 50000 fibres, generally having a diameter of 8-10 microns, impregnated with suitable resins, for example polyurethane.

The filaments are thus chopped to lengths of less than 30 mm before being inserted in the mixture for the formation of the CCM preform. The filaments are generally defined based on the number of fibres that make up the band, for example 3K, 10K and 50K respectively correspond to 3000, 10000 and 50000 fibres per band.

In an embodiment, the length of the filaments that are used in the layer of CCM that forms the inner layer of the shaped composite material of the invention will be comprised between 6 and 10 mm.
The diameter of the filaments essentially consisting of carbon can be comprised between 0.1 and 2 mm, preferably between 0.3 and 0.5 mm.

In a particular embodiment, the inner layer of CCM can contain reinforcement fibres. Such reinforcement fibres can be distributed at random or be localised in certain regions of the inner layer, for example in the areas that can be most subject to cracking. Possibly, the reinforcement fibres can be arranged in an oriented manner, for example in circumferential configuration.

The inner layer of CCM preform in the shaped composite material in the moulding step has a composition, expressed as percentages by weight, which can vary in the ranges given below:
carbon fibres 40-70%, preferably 50-60%
Binder 10-50%, preferably 30-40%
Additives and/or fillers 0.5-20%, preferably 1-10%.
In the finished product after infiltration of silicon, the material of the inner layer CCM will have a composition, expressed as percentages by weight, which can vary in the ranges given below:
carbon fibres 30-65%, preferably 35-55%
silicon 5-25%, preferably 10-20%
SiC 25-55%, preferably 35-50%.

The binder can be of the conventional type and can for example be selected from the group consisting of phenolic and acrylic resins, paraffin, coal-tar pitches and polystyrene. Preferably, the binder consists of coal-tar pitches or phenolic resins.

The additives can also be of the conventional type and consist of particles of inorganic materials, like graphite powder, silicon carbide (SiC), carbides and nitrides of metals, metals.

The outer layers of composite material with orderly fabric structure (CCM-R) comprise a two or three-dimensional fabric. Each outer layer of CCM-R comprises one or more stacked sheets of two or three-dimensional fabric. The number of such sheets of fabric will depend on the thickness of the outer layer of CCM-R preform that is wished to be used.

The material of the outer layer is densified with carbon as will be described hereafter, so as to obtain a composition, expressed as percentages by weight, which can vary within the ranges given below:
carbon fibres 15-50%, preferably 20-35%
carbon binder 50-85%, preferably 65-80%.
In the finished product after infiltration of silicon, the material of the outer CCM-R layer will have a composition, expressed as percentages by weight, which can vary within the ranges given below:
carbon fibres 5-40%, preferably 10-25%
carbon binder 5-40%, preferably about 10-20%
silicon 15-60%, preferably about 15-25%
SiC 20-60%, preferably 30-50%.

The thickness of the outer layers of CCM-R with orderly fabric structure just like that of the inner layer of CCM comprising short and disorderly filaments can vary according to requirements.

Figure 2:
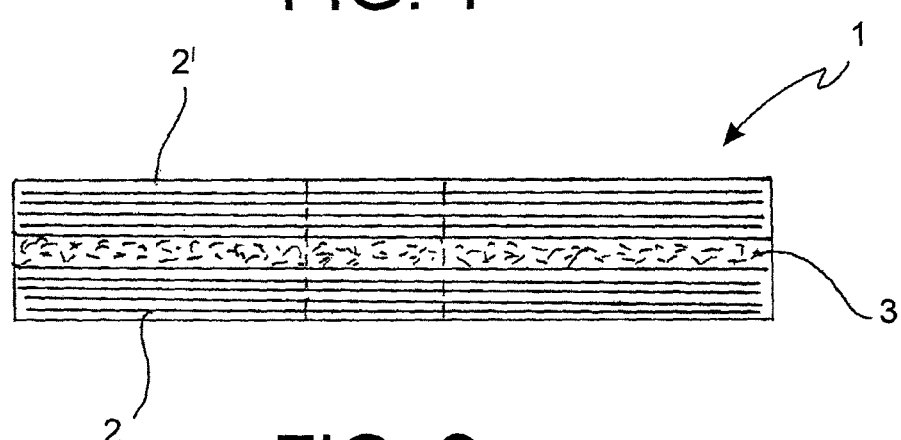
FIG. 2 represents a section view of a variant of the embodiment of FIG. 1.
Figure 3:
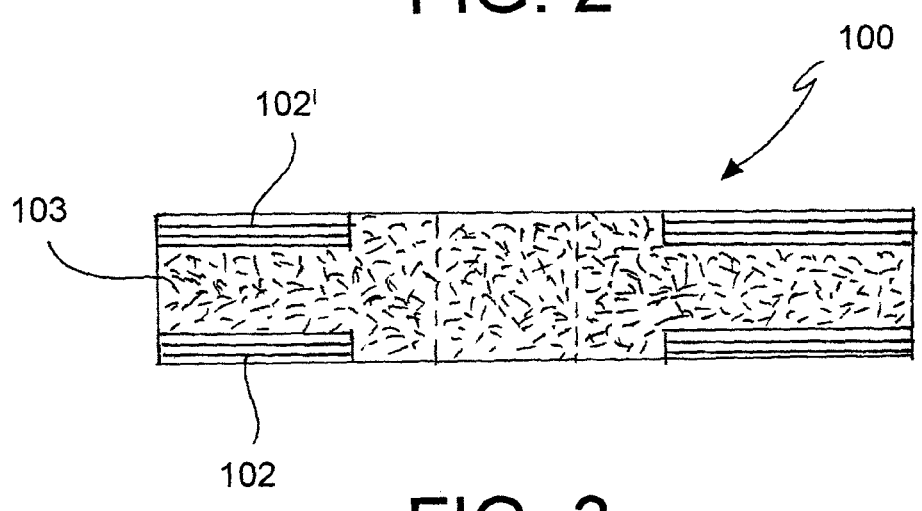
FIG. 3 represents a section view of a second embodiment of a disc for a disc brake made with the shaped composite material of the invention.

FIGS. 1-3 show different types of discs for disc brakes according to the invention, in which the central hole of the disc has been marked with a dotted line.

A first embodiment of the shaped composite material 1, shown in FIG. 1, comprises two outer layers 2, 2' of CCM-R (as defined above) of low thickness and an inner layer 3 of CCM of greater thickness. The minimum thickness of each of the outer layers 2, 2' is about 1 mm.

In the variant of such an embodiment shown in FIG. 2 the thickness of the inner layer 3 has been reduced to the minimum, consequently increasing the thickness of the outer layers 2 and 2'. The minimum thickness of the inner layer 3 will be that necessary to make the ventilation channels, having dimensions comprised between 2 and 15 mm. The ventilation channels can take up variable and complex shapes and dimensions, also being able to be made with disposable cores. Preferably, the ventilation channels are circular and have a diameter of about 5 mm or sub-rectangular with axis greater than 10 mm. Alternatively, the ventilation channels are not circular or rectangular in shape.

In the embodiment of FIG. 3 of the shaped composite material, indicated with number 100, the outer layers 102, 102' do not extend for the entire radial width of the disc, but cover just the radially outer band, whereas the portion contiguous to the central hole of the disc is made from the CCM material of the inner layer. The advantage of this embodiment is essentially a reduction in production costs.

The shaped composite material according to the invention can be obtained with the process that will be described hereafter and that comprises the following steps:
a) preparation of two preforms of CCM-R material densified with carbon and having an orderly fabric structure, b) arrangement in a mould of the two preforms obtained according to step a) to constitute respective outer layers and of an intermediate layer of a precursor mixture of the CCM preform, c) moulding and pyrolysis of the three-layer material obtained in step b), d) infiltration with silicon at high-temperature of the semi-worked product obtained in step c), e) dry and/or wet finishing of the shaped composite material.

Step a) of preparation of the preforms of CCM-R in turn comprises the following stages in succession:

1) providing one or more sheets of two-dimensional fabric to form a model of the preform, 2) optionally, needling the sheets of fabric stacked to form an entangled three-dimensional structure, 3) optionally, impregnating the preform model obtained in stage 1) or 2) with resins, 4) optionally subjecting the preform model obtained in one of the stages 1), 2) or 3) to a heat pretreatment, 5) subjecting the preform model of stage 4) to a carbon densifying process up to a density of the material comprised between 1.3 and 1.45 g/cc.

6) subjecting the preform model obtained in stage 5) to a heat treatment.

The fabric used in stage 1) can be a fabric made from carbon fibre.

The needling of stage 2) can be carried out with conventional methods, which foresee the use of needle combs that penetrate into the weft of the woven fabric, unravel it and tend to tangle together the various sheets.

The resins that can be used in stage 3) are those defined above for the inner layer of CCM.

The heat treatment of stages 4) and 6) is very important in order to give high heat conductivity to the material. Such heat treatment comprises treatment in an oven in inert atmosphere or in a vacuum up to temperatures comprised between 1800 and 2550° C.

The densifying process with carbon according to stage 5) can be carried out with a different type of method.

A first method is CVD (Chemical Vapour Deposition) or CVI (Chemical Vapour Infiltration), according to whether there is just one coating or an infiltration of the carbon in the form of vapour. Typically, if the material is fibrous and therefore has high porosity, we talk of Chemical Vapour Infiltration. These methods foresee the vaporisation of a precursor of carbon and the exposure of the material to be treated to such vapours at high temperatures and low pressures and in the presence of an inert gas such as argon. As precursor it is possible to use methane or propane. The operating temperatures are of the order of 1000-1400° C., preferably 1200-1300° C. and the operating pressure is less than 300 mbar, preferably a few tens of mbar. The precursor gas of carbon decomposes forming elementary carbon that is then deposited or infiltrated in the matrix of the material to be treated. This method, which requires the use of specially dedicated ovens, foresees the deposition on the fibres of a thin layer (typically a few microns), so that in order to obtain the desired densification it is necessary to have various infiltration cycles and overall covering on the fibres of more than ten microns (typically 10-20 microns).

A different method, known as LPI (Liquid Polymer Infiltration) or PIP (Polymer Infiltration and Pyrolysis) foresees the infiltration of the matrix of the material to be treated with a liquid polymer and the subsequent heat treatment at a high temperature (pyrolysis) that causes the carbonization of the polymer deposited on the carbon fibres. If the heating is suitably long, the carbon can transform into a structure like graphite. Also in this case it is necessary to have various stages of infiltration and pyrolysis before obtaining a suitable densification of the preform.

Irrespective of the method used for the carbon densification stage, it is in any case essential for the density of the material of the CCM-R preform to be comprised between 1.3 and 1.45 g/cc. This density, which is less than the density of about 1.8 g/cc of the same material (C/C) already known in discs for disc brakes, is necessary to ensure a sufficient porosity of the matrix, so as to allow the silicon to penetrate and react both with the CCM-R preform of the outer layers and with the CCM preform of the inner layer.

The preforms of CCM-R obtained according to step a) of the process of the invention can undergo a pre-finishing so as to prepare the surface for the subsequent steps.

According to step b) of the process, a first preform of CCM-R of step a) is arranged in a suitable shaped mould, for example a mould for discs for a disc brake, to form a bottom layer. Then the first preform has the CCM preform mixture, which will form the intermediate layer of CCM, comprising short and disorderly filaments of carbon, added to it. Finally, the layer of said mixture has the second CCM-R preform arranged on it to form a covering layer.

In the case of the embodiment shown in FIG. 3, the upper preform will not cover the entire surface of the intermediate layer, so that it will be necessary to add a portion of mixture for the intermediate layer at the end so as to fill the resulting empty space.

The precursor mixture of the CCM material can comprise between 50% and 80% in volume of said filaments essentially consisting of carbon. In the final material, such a percentage will decrease after the partial reaction of the carbon with the silicon to form SiC.

Step c) of the process comprises a first stage i) of co-moulding the preforms obtained according to step a) with the precursor mixture of the CCM material comprising filaments essentially consisting of carbon to form a sandwich structure, and a subsequent stage ii) of pyrolysis of the sandwich structure of stage i).

Stage i) of co-moulding is carried out in a conventional manner operating at temperatures comprised between 80° C. and 180° C., preferably between 120° C. and 150° C., and at a pressure comprised between 0.1 N/cm$^2$ and 5 N/cm$^2$, preferably at 0.5-1 N/cm$^2$.

This co-moulding stage of a sandwich structure comprising the preforms described above and the intermediate CCM material is essential for the purposes of the present invention. The end result is indeed a new preform consisting of a composite material equipped with high compactness, with high cohesion between the three layers, which prevents breaking at the interface between the layers in all of the successive steps of production (pyrolysis and infiltration) and use as has been verified experimentally. This seems to be due to the fact that some fibres and the binder present in the precursor mixture of the CCM penetrate during this stage into the interface pores of the preforms, contributing to an effective welding of the layers to one another.

The shaped and compacted semi-worked product is then removed from the mould and subjected to the stage ii) of pyrolysis, so as to carbonize the binder. Stage ii) is carried out in a conventional furnace at a temperature that depends on the type of binder used and that is generally comprised between 900° C. and 1200° C.

The stage ii) of pyrolysis is carried out under a flow of an inert gas such as nitrogen or argon and at a pressure comprised between 10 and 100 mbar, preferably 20-30 mbar.

The flow of inert gas also has the function of advantageously removing the gases that are released by the pyrolysis of the binder. In this step, moreover, the semi-worked product acquires a high porosity, which is essential for the subsequent step of infiltration of silicon.

Optionally, the semi-worked product coming out from step c) can undergo a surface finishing so as to eliminate any surface deformation. Such a finishing treatment is preferably carried out dry, for example through diamond honing.

Step d) of infiltration of the semi-worked product obtained in step c) with silicon is carried out in a conventional manner and foresees the introduction of the semi-worked product into a treatment chamber having a volume approximately double the volume of the semi-worked product. Part of the empty space is filled with silicon so that the semi-worked product is in contact with it. The amount of silicon is thus that which is required to fill the porosities of the semi-worked product or it is slightly in excess. For example, for a disc of standard dimensions it is possible to use an amount by weight of silicon equal to the weight of the semi-worked product with a further addition of 500 gr of silicon. The silicon is in pure form or in the form of silicon/aluminium or silicon/copper alloy and comes in granules or in powder.

The treatment chamber is equipped with suitable venting openings for the gases that are released during treatment.

The treatment chamber is then introduced in a suitable conventional furnace, which is heated gradually to a temperature comprised between 1420° C. and 1700° C., for example about 1550° C. At these temperatures the silicon melts and infiltrates into the pores of the semi-worked product and reacts with part of the carbon to form silicon carbide (SiC).

Preferably, the operating pressure is low, comprised between 0.1 mbar and 20 mbar, more preferably between 1 and 10 mbar.

Both the heating to the treatment temperature and the subsequent cooling are carried out gradually. For example, it is possible to use up to 8 or more hours to reach a treatment temperature of about 1550° C. and a similar time to cool the infiltrated semi-worked product.

The step d) of infiltration of silicon has the function of densifying the material to values comprised between 2 and 2.4 g/cmc with the silicon and the silicon carbide that forms by reaction between the carbon and the silicon itself, closing the porosity of the material to values of less than 3%. Moreover, this step has the function of welding together the three layers of the material.

The shaped composite material that is obtained according to this process has unexpectedly demonstrated extremely advantageous properties, which approach those of known CCM-R instead of an average of those of the two separate CCM and CCM-R materials, as would have been expected. This is due to the topologization of the use of the two materials.

Table 1 provides a comparison between conventional CCM material containing filaments essentially consisting of carbon (CCM), just the material with orderly fabric structure and densified with carbon (CCM-R) and the shaped composite material of the invention (INV).

The flexural strength was measured at a load speed of 20 N/s, with distance of the supports of 100 mm, thickness of the test piece of 10 mm and width of the test piece of 20 mm.

TABLE 1

|  |  | CCM | CCM-R | INV |
|---|---|---|---|---|
| Flexural strength (MPa) | XY45° |  | 70-100 | 60-90 |
|  | XY90° | 45-65 | 130-200 | 120-170 |
| Elastic modulus (GPa) | XY45° | 20-25 | 20-30 | 20-30 |
|  | XY90° |  | 25-35 | 25-35 |
| Heat conductivity (W/mK at 400° C.) | XY | 10-25 | 50-80 | 50-80 |
|  | Z |  | 40-60 | 30-60 |
| Thermal expansion coefficient ($K^{-1} \cdot 10^{-6}$ at 1000° C.) |  | 1.8-2.2 | 1.8-2.2 | 1.8-2.2 |
| Density (g/cm³) |  | 2-2.2 | 2.1-2.4 | 2.1-2.4 |

Moreover, the inner layer of CCM has a much lower cost than that of preforms in CCM-R described above, so that it can be worked or moulded easily, for example making the ventilation openings already in the moulding step thanks to the provision in the mould of suitable cores.

The shaped composite material of the invention has thus displayed optimal characteristics of mechanical strength and of heat dispersion for high performance applications, such as use in braking systems for sports cars and high performance cars, at a much lower cost than that of discs made from CCM-R described earlier.

It is clear that what has been described is just a particular embodiment of the present invention. The man skilled in the art will be able to bring any necessary modifications to both the shaped composite material and to the process for obtaining it to adapt it to particular conditions, without however departing from the scope of protection as defined in the attached claims.

For example, it will be possible to prepare the outer layers and the inner layer separately as described earlier and assembly the final composite material for example through the use of suitable conventional fastening means for the preparation of multi-layer ceramic materials.

The invention claimed is:

1. Shaped composite material comprising an inner layer of CCM C/SiC/Si material comprising short and disorderly filaments, essentially consisting of carbon, and respective outer layers of C/SiC/Si material having a fabric structure, wherein the outer layers of C/SiC/Si material have outer friction surfaces, and wherein the shaped composite material has the following characteristics:
   flexural strength XY45° 60-90 MPa
   flexural strength XY90° 120-170 MPa.

2. Material according to claim 1, wherein said inner layer and said respective outer layers are welded through Si and/or SiC.

3. Material according to claim 1, wherein the length of the filaments of the layer of CCM that forms the inner layer of the shaped composite material is comprised between 6 and 10 mm.

4. Material according to claim 1, wherein the diameter of the filaments essentially consisting of carbon is comprised between 0.1 and 2 mm.

5. Material according to claim 1, wherein the inner layer of CCM contains reinforcement fibers, randomly distributed or localized in the regions of the inner layer most subject to cracking, in an oriented manner.

6. Material according to claim 1, wherein the inner layer of CCM has a composition, expressed as percentages by weight, that varies within the ranges given below:
   filaments essentially consisting of carbon, 30-65%
   silicon 5-25%
   SiC 25-55%.

7. Material according to claim 6, wherein the inner layer is obtained from a CCM preform having a composition by weight that varies within the ranges given below:
carbon filaments 40-70%
binder 10-50%
additives and/or fillers 0.5-20%.

8. Material according to claim 7, wherein the binder is selected from the group consisting of phenolic and acrylic resins, paraffin, coal-tar pitches and polystyrene.

9. Material according to claim 7, wherein the additives consist of particles of inorganic materials, graphite powder, SiC, carbides, nitrides of metals or metals.

10. Material according to claim 7, wherein said inner layer and said respective outer layers comprise interface pores and wherein the carbon filaments and binder present in the precursor mixture of CCM are interpenetrated in said interface pores so as to bind together said inner and outer layers.

11. Material according to claim 1, wherein the fabric structure of the outer layers is orderly and woven, and has a composition by weight that varies within the ranges given below:
carbon filaments 5-40%
carbon binder 5-40%
silicon 15-60%
SiC 20-60%.

12. Material according to claim 11, wherein the outer layers are obtained from CCM-R preforms having a composition by weight that varies within the ranges given below:
carbon filaments 15-50%
carbon binder 50-85%.

13. Material according to claim 1, wherein the minimum thickness of each of the outer layers is about 1 mm.

14. Material according to claim 1, wherein the minimum thickness of the inner layer is comprised between 2 and 15 mm.

15. Material according to claim 1, wherein said composite material is shaped to form a disc for disc brakes.

16. Material according to claim 15, wherein the outer layers do not extend for the entire radial width of the disc, but cover just a radially outer band, whereas the portion contiguous to a central hole of the disc is made from the CCM material of the inner layer.

17. Material according to claim 1, wherein the inner layer of CCM has a composition, expressed as percentages by weight, that varies within the ranges given below:
filaments essentially consisting of carbon, 35-55%
silicon 10-20%
SiC 35-50%.

18. Material according to claim 17, wherein the inner layer is obtained from a CCM preform having a composition by weight that varies within the ranges given below:
carbon filaments 50-60%
binder 30-40%
additives and/or fillers 1-10%.

19. Material according to claim 1, wherein said composite material is shaped to form a disc for a disc brake, and wherein the inner layer includes molded ventilation channels.

20. Shaped composite material obtained by a process for making the shaped composite material according to claim 1, the process comprising the following steps:
a) preparation of two preforms of C/C C/SiC material densified with carbon and having a fabric structure,
b) arrangement in a mold of the two preforms obtained according to step a) to constitute respective outer layers and of an intermediate layer of a precursor mixture of the CCM preform,
c) molding and pyrolysis of the three-layer material obtained in step b),
d) infiltration with silicon of the semi-worked product obtained in step c),
e) dry and/or wet finishing of the shaped composite material.

21. Shaped composite material comprising an inner layer of CCM C/SiC/Si material comprising:
short and disorderly filaments, essentially consisting of carbon, and
respective outer layers of C/SiC/Si material having a fabric structure,
wherein the outer layers of C/SiC/Si material have outer friction surfaces,
wherein the fabric structures of the outer layers each include stacked sheets of fabric, wherein the stacked sheets are entangled with each other, and wherein the fabric structures have a composition by weight that varies within the ranges given below:
carbon filaments 10-25%
carbon binder about 10-20%
silicon about 15-25%
SiC 30-50%, and
wherein the shaped composite material has the following characteristics:
flexural strength XY45° 60-90 MPa
flexural strength XY90° 120-170 MPa.

22. Material according to claim 21, wherein the outer layers are obtained from CCM-R preforms having a composition by weight that varies within the ranges given below:
carbon filaments 20-35%
carbon binder 65-80%.

* * * * *